US012733486B2

(12) United States Patent
Kim et al.

(10) Patent No.: US 12,733,486 B2
(45) Date of Patent: Sep. 8, 2026

(54) INDUCTOR PERFORMANCE ENHANCEMENT USING AN OUTER, PERIPHERAL PATTERNED GROUND SHIELD

(71) Applicant: QUALCOMM Incorporated, San Diego, CA (US)

(72) Inventors: Jonghae Kim, San Diego, CA (US); Je-Hsiung Lan, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 451 days.

(21) Appl. No.: 18/468,536

(22) Filed: Sep. 15, 2023

(65) Prior Publication Data

US 2025/0096116 A1 Mar. 20, 2025

(51) Int. Cl.

| | |
|---|---|
| ***H10W 20/40*** | (2026.01) |
| ***H01F 17/00*** | (2006.01) |
| ***H10D 1/20*** | (2025.01) |
| ***H10W 20/41*** | (2026.01) |
| ***H10W 44/20*** | (2026.01) |

(52) U.S. Cl.
CPC ...... *H10W 20/497* (2026.01); *H01F 17/0006* (2013.01); *H10D 1/20* (2025.01); *H10W 20/423* (2026.01); *H10W 44/20* (2026.01); *H01F 2017/008* (2013.01); *H10W 44/241* (2026.01)

(58) Field of Classification Search
CPC ....... H01L 23/5227; H01L 23/66; H10D 1/20; H01F 17/0006; H10W 20/497
See application file for complete search history.

(56) References Cited

U.S. PATENT DOCUMENTS

| | | | | |
|---|---|---|---|---|
| 7,531,407 | B2 * | 5/2009 | Clevenger | H10W 20/20 257/E21.022 |
| 8,427,266 | B2 | 4/2013 | Wu et al. | |
| 8,492,872 | B2 | 7/2013 | Yang et al. | |
| 8,559,186 | B2 * | 10/2013 | Jin | H01L 23/5225 257/527 |
| 9,318,432 | B2 * | 4/2016 | Lenive | H01L 23/5225 |
| 12,014,981 | B2 * | 6/2024 | Nuebling | H10D 1/20 |
| 2006/0049481 | A1 * | 3/2006 | Tiemeijer | H01F 17/0006 257/531 |
| 2008/0020488 | A1 * | 1/2008 | Clevenger | H10W 20/20 438/3 |
| 2012/0242446 | A1 * | 9/2012 | Wu | H01F 17/0006 336/192 |
| 2018/0083589 | A1 * | 3/2018 | Yun | H03H 7/463 |
| 2018/0190584 | A1 * | 7/2018 | Upadhyaya | H10W 20/423 |
| 2019/0356294 | A1 * | 11/2019 | Park | H01F 17/0013 |
| 2022/0285080 | A1 * | 9/2022 | Kim | H01F 17/0013 |
| 2023/0369204 | A1 * | 11/2023 | Nuebling | H10D 1/20 |

FOREIGN PATENT DOCUMENTS

KR 100759252 B1 9/2007

OTHER PUBLICATIONS

International Search Report and Written Opinion—PCT/US2024/043484—ISA/EPO—Nov. 22, 2024.

* cited by examiner

*Primary Examiner* — Steven M Page
(74) *Attorney, Agent, or Firm* — Seyfarth Shaw LLP

(57) ABSTRACT

A device is described, in which the device includes a substrate. The device includes a multiturn inductor coupled to the substrate. The device also includes a patterned ground shield on a periphery of the multiturn inductor and coupled to the substrate.

19 Claims, 11 Drawing Sheets

INDUCTOR PERFORMANCE ENHANCEMENT USING AN OUTER, PERIPHERAL PATTERNED GROUND SHIELD

BACKGROUND

Field

Aspects of the present disclosure relate to semiconductor devices and, more particularly, to an inductor performance enhancement using an outer, peripheral patterned ground shield.

Background

Wireless communications devices incorporate radio frequency (RF) modules that facilitate the communication and features users expect. As wireless systems become more prevalent and include more capabilities, the chips become more complex. Fifth generation (5G) new radio (NR) and sixth generation (6G) wireless communications devices incorporate the latest generation of electronic dies that are packed into smaller modules with smaller interconnections. Design challenges include integrating passive devices and active devices to implement RF front-end (RFFE) modules.

An RFFE module may be implemented by integrating RF filters, active devices, and surface-mount technology (SMT) devices on a laminate substrate. These RF filters, active devices, and SMT devices are conventionally arranged in a side-by-side package configuration supported by a laminate substrate. Unfortunately, these conventional side-by-side on package laminate configurations may not work well in a reduced form factor of future applications. Additionally, crosstalk between the conventional side-by-side on package laminate configurations may degrade performance as well as reduce key performance indicators (KPIs) of inductors. An RF integrated circuit (RFIC) implementation that meets the reduced form factor of future advanced process nodes is desired.

SUMMARY

A device is described, in which the device includes a substrate. The device includes a multiturn inductor coupled to the substrate. The device also includes a patterned ground shield on a periphery of the multiturn inductor and coupled to the substrate.

A method for fabricating a device having a patterned ground shield on a periphery of a multiturn inductor is described. The method includes forming an active device layer in a substrate. The method also includes forming the patterned ground shield from first back-end-of-line (BEOL) layers coupled to the substrate. The method further includes forming the multiturn inductor from second BEOL layers coupled to the first BEOL layers, in which the patterned ground shield is formed on the periphery of the multiturn inductor.

This has outlined, broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for conducting the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
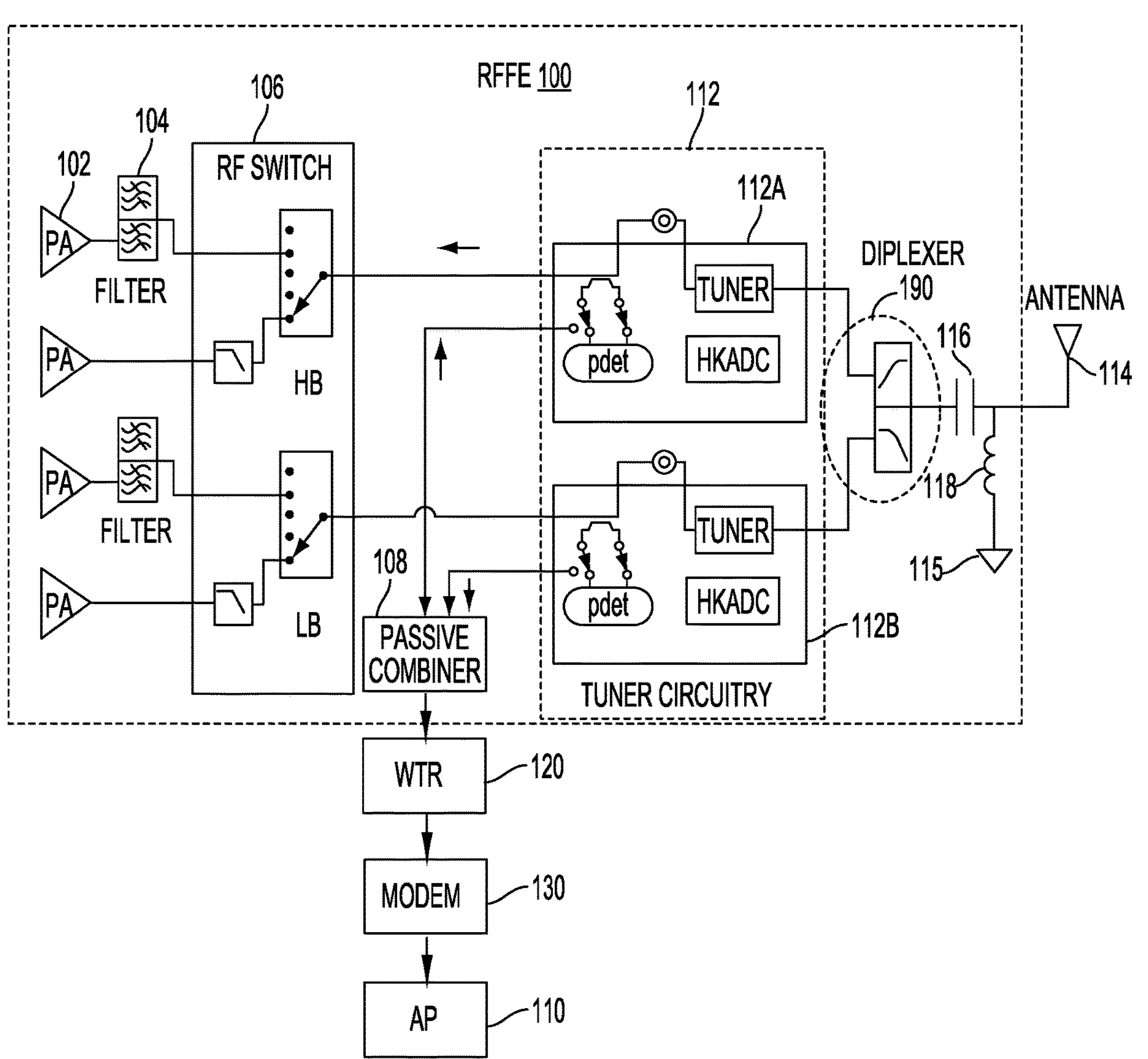
FIG. 1 is a schematic diagram of a radio frequency front-end (RFFE) module employing a patterned ground shield on a periphery of an inductor.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Wireless communications devices incorporate radio frequency (RF) modules that facilitate the communication and features users expect. As wireless systems become more prevalent and include more capabilities, the chips become more complex. For example, mobile RF chips (e.g., mobile RF transceivers) have migrated to a deep sub-micron process node due to cost and power consumption considerations. Designing mobile RF transceivers is complicated by added circuit functions for supporting communications enhancements, such as fifth generation (5G) new radio (NR) communications systems. In particular, 5G NR wireless communications devices incorporate the latest generation of electronic dies that are packed into smaller modules with smaller interconnections. Design challenges include integrating passive devices and active devices to implement RF front-end (RFFE) modules.

RF filters in mobile RF transceivers may include high performance capacitor and inductor components. For example, RF filters use several types of passive devices, such as integrated capacitors and integrated inductors. Integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are passive elements used in integrated circuits for storing an electrical charge. For example, parallel plate capacitors are often made using plates or structures that are conductive with an insulating material between the plates.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at millimeter wave (mmW) frequencies (e.g., frequency range two (FR2)).

A radio frequency (RF) front-end (RFFE) module may include a high-performance RF filter including inductors and transformers. In practice, an RFFE module may be implemented by integrating RF filters, active devices, and surface-mount technology (SMT) devices on a laminate substrate. These RF filters, active devices, and SMT devices are conventionally arranged in a side-by-side package configuration supported by a laminate substrate. Unfortunately, this conventional side-by-side on package laminate configuration may not fit within a reduced form factor of future RF applications. That is, the conventional side-by-side on package laminate configurations may exceed the form factor of future RFFE module applications. An RFFE module implementation that has a reduced form factor is desired.

Various aspects of the present disclosure provide a patterned ground shield on a periphery of an inductor. The process flow for fabrication of the inductive device structure may include wafer-level processes, such as front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms "integrated circuit," "chip" and "die" may be used interchangeably.

As described, the BEOL interconnect layers may refer to the conductive interconnect layers (e.g., a first interconnect layer (M1) or metal one M1, metal two (M2), metal three (M3), metal four (M4), etc.) for electrically coupling to FEOL active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to MOL interconnect layers, for example, to connect M1 to an oxide diffusion (OD) layer of an integrated circuit. The MOL interconnect layer may include a zero-interconnect layer (M0) for connecting M1 to an active device layer of an integrated circuit. A BEOL second via (V2) may connect M2 to M3 or others of the BEOL interconnect layers. The BEOL vias may also provide a via pad (VP) to support package (or device) interconnects, such as package balls.

Various aspects of the present disclosure are directed to a patterned ground shield on a periphery of an inductor. In some aspects of the present disclosure, the patterned ground shield is coupled to a substrate having an active device layer through a first BEOL layer, such as an M1 metal layer. In some aspects of the present disclosure, the patterned ground shield is formed between the M1 metal layer and a second BEOL layer, such as an M2 metal layer. According to various aspects of the present disclosure, the inductor is formed from an upper BEOL metal layer, above the M2 metal layer.

FIG. 1 is a schematic diagram of a radio frequency front-end (RFFE) module 100 employing a patterned ground shield on a periphery of an inductor, according to aspects of the present disclosure. The RFFE module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RFFE module 100.

The radio frequency front-end (RFFE) module 100 also includes tuner circuitry 112 (e.g., first tuner circuitry 112A and second tuner circuitry 112B), the diplexer 190, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog-to-digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 190 is between the tuner component of the tuner circuitry 112 and the capacitor 116, the inductor 118, and the antenna 114. The diplexer 190 may be placed between the antenna 114 and the tuner circuitry 112 to provide high system performance from the radio frequency front-end (RFFE) module 100 to a chipset including the wireless transceiver 120, the modem 130, and the application processor 110. The diplexer 190 also performs frequency domain multiplexing on both high band frequencies and low band frequencies. After the diplexer 190 performs its frequency multiplexing functions on the input signals, the output of the diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
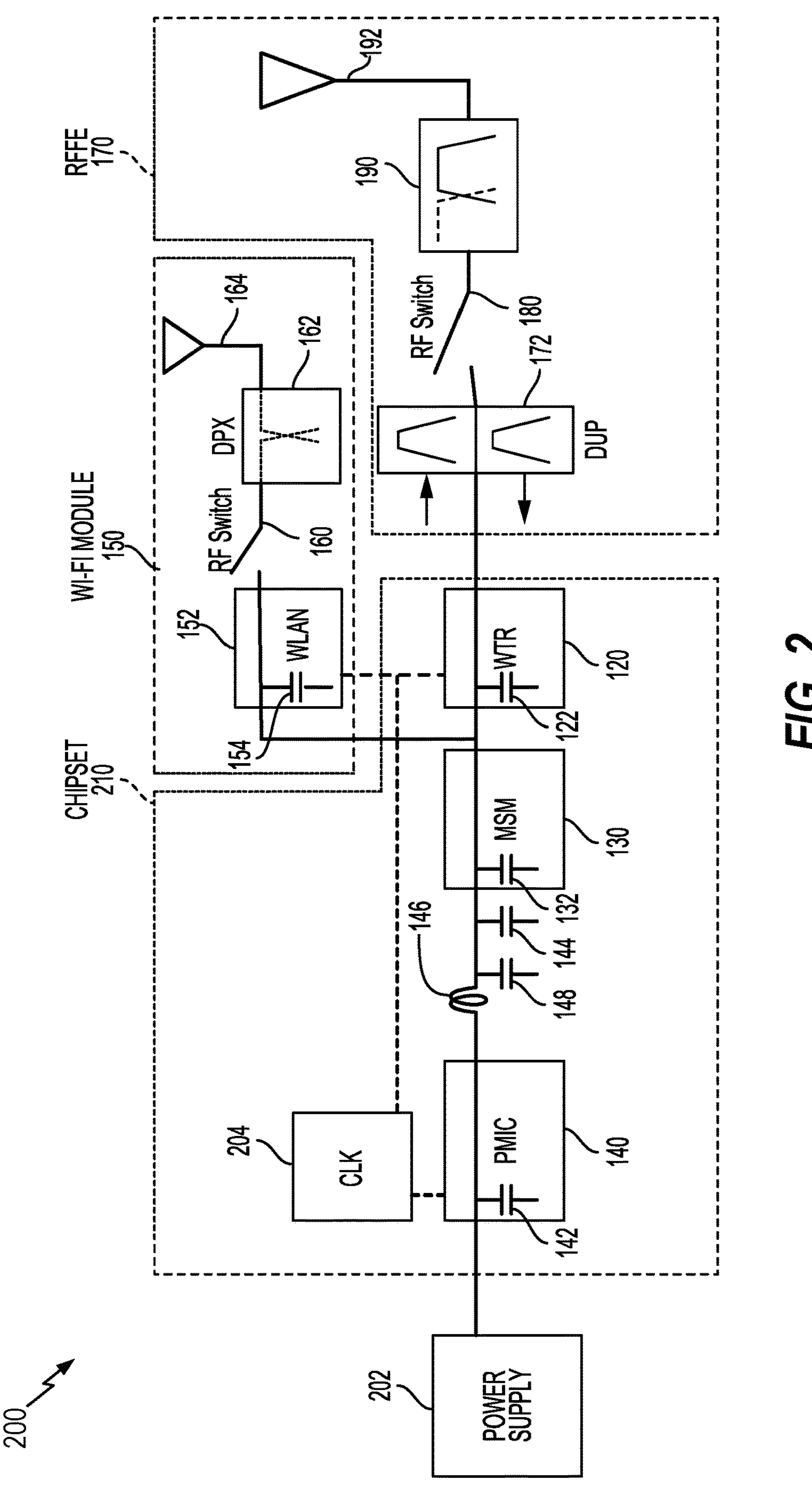
FIG. 2 is a schematic diagram of a radio frequency integrated circuit (RFIC) employing active and passive devices for a chipset.

FIG. 2 is a schematic diagram of a radio frequency integrated circuit (RFIC) 200, having a wireless local area network (WLAN) (e.g., Wi-Fi) module 150 and a radio frequency front-end (RFFE) module 170 for a chipset 210. The Wi-Fi module 150 includes a first diplexer 162 communicably coupling an antenna 164 to a WLAN module 152. A first RF switch 160 communicably couples the first diplexer 162 to the WLAN module 152. The RFFE module 170 includes a second diplexer 190 communicably coupling an antenna 192 to a wireless transceiver (WTR) 120 through a duplexer 172. A second RF switch 180 communicably couples the second diplexer 190 to the duplexer 172.

The WTR 120 and the WLAN module 152 of the Wi-Fi module 150 are coupled to a modem (mobile station modem (MSM), e.g., baseband modem) 130 that is powered by a power supply 202 through a power management integrated circuit (PMIC) 140. The chipset 210 also includes capacitors 144 and 148, as well as an inductor(s) 146 to provide signal integrity. The PMIC 140, the modem 130, the WTR 120, and the WLAN module 152 each include capacitors (e.g., 142, 132, 122, and 154) and operate according to a clock 204. In addition, the inductor 146 couples the modem 130 to the PMIC 140. The geometry and arrangement of the various inductor and capacitor components in the RFIC) 200 may reduce the electromagnetic coupling between the components.

The WTR 120 of the wireless device includes a mobile RF transceiver to transmit and receive data for two-way communications. The WTR 120 and the RFFE module 170 may be implemented using high performance complementary metal oxide semiconductor (CMOS) RF switch technologies to implement switch transistors of the first RF switch 160 and the second RF switch 180. The RFFE module 170 may rely on these high-performance CMOS RF switch technologies to implement an active die for successful operation. In practice, the active die used to implement the CMOS RF switch technology may involve integration with analog/RF circuitry to implement an antenna module, for example, as shown in FIG. 3.

Figure 3:
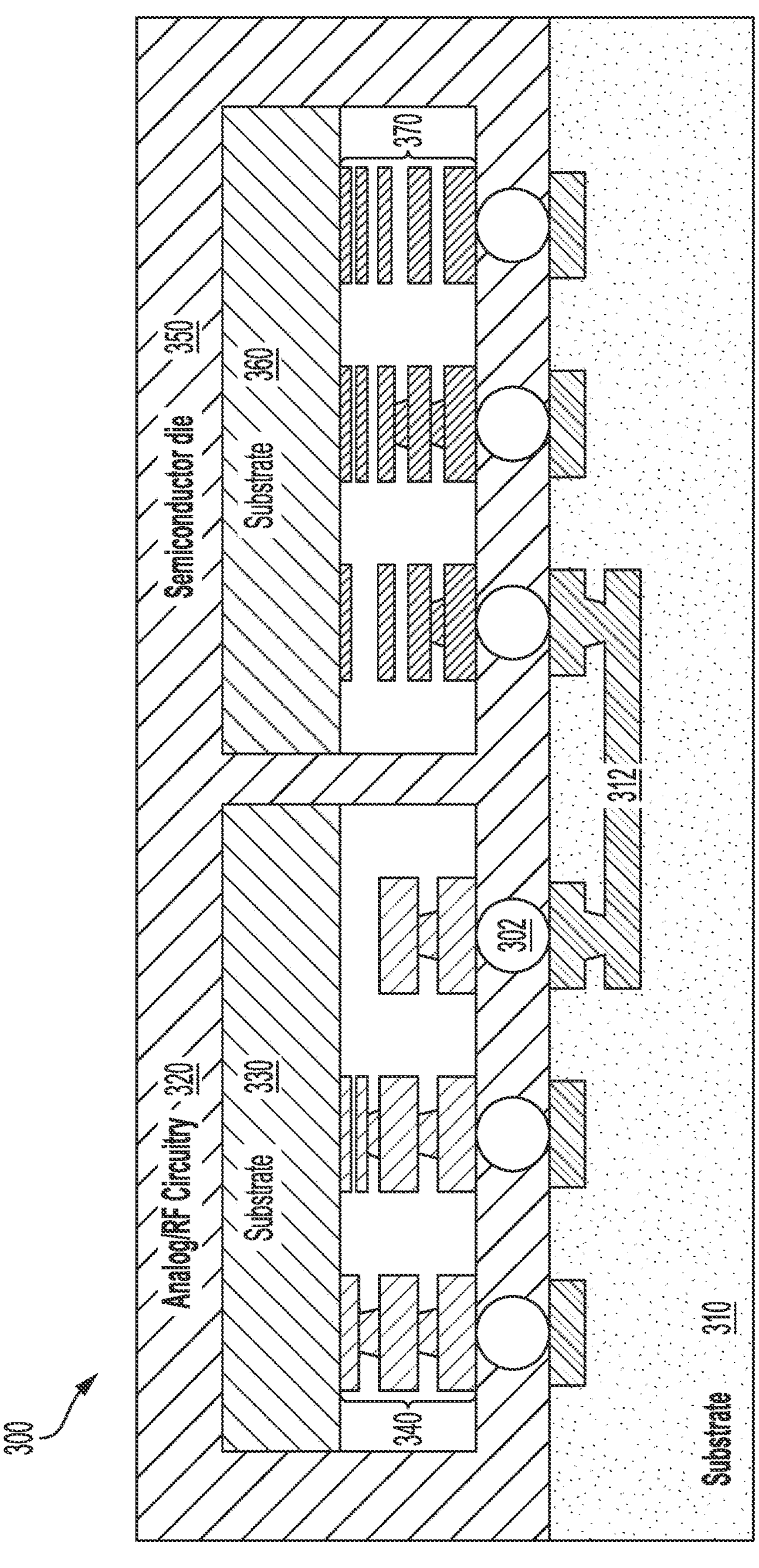
FIG. 3 is a block diagram illustrating a cross-sectional view of a radio frequency integrated circuit (RFIC) including a semiconductor die and an analog/RF circuitry die, in accordance with various aspects of the present disclosure.

FIG. 3 is a block diagram illustrating a cross-sectional view of a radio frequency integrated circuit (RFIC) 300 including a semiconductor die and an analog/RF die, in accordance with various aspects of the present disclosure. In this example, the RFIC 300 includes a semiconductor die 350 and an analog/RF circuitry die 320 supported by a package substrate 310 (e.g., a laminate substrate). The semiconductor die 350 may be an active die having a semiconductor substrate 360 (e.g., an active silicon substrate) coupled to package balls 302 through back-end-of-line (BEOL) layers 370. The BEOL layers 370 include multiple BEOL metallization layers (M1, M2, M3, . . . , Mn) on the semiconductor substrate 360 (e.g., a diced silicon wafer). A redistribution layer 312 is coupled to the package balls 302.

The analog/RF circuitry die 320 includes a substrate 330 coupled to the package balls 302 through BEOL layers 340. The redistribution layer 312 is coupled to the analog/RF circuitry die 320 through the package balls 302. In some aspects of the present disclosure, the substrate 330 is composed of glass, and the analog/RF circuitry die 320 is a glass-substrate integrated passive device (GIPD) filter die. In practice, the RFIC 300 integrates the analog/RF circuitry die 320, the semiconductor die 350, and surface-mount technology (SMT) devices on the package substrate 310 (e.g., laminate). The analog/RF circuitry die 320, the semiconductor die 350, and the SMT devices (not shown) are arranged in a side-by-side on package substrate configuration supported by the package substrate 310.

Unfortunately, this side-by-side on package substrate configuration of the analog/RF circuitry die 320 and the semiconductor die 350 shown in FIG. 3 may not fit within the reduced form factor of future RF applications. That is, the conventional side-by-side on package substrate configurations may exceed the form factor of future RFFE module applications in advanced process nodes. Additionally, crosstalk between the analog/RF circuitry die 320 and the semiconductor die 350 may degrade performance as well as reduce key performance indicators (KPIs) of an inductor in the analog/RF circuitry die 320. An RFFE implementation that meets the reduced form factor of future advanced process nodes is shown, for example, in FIGS. 4A to 4C.

Figure 4B:
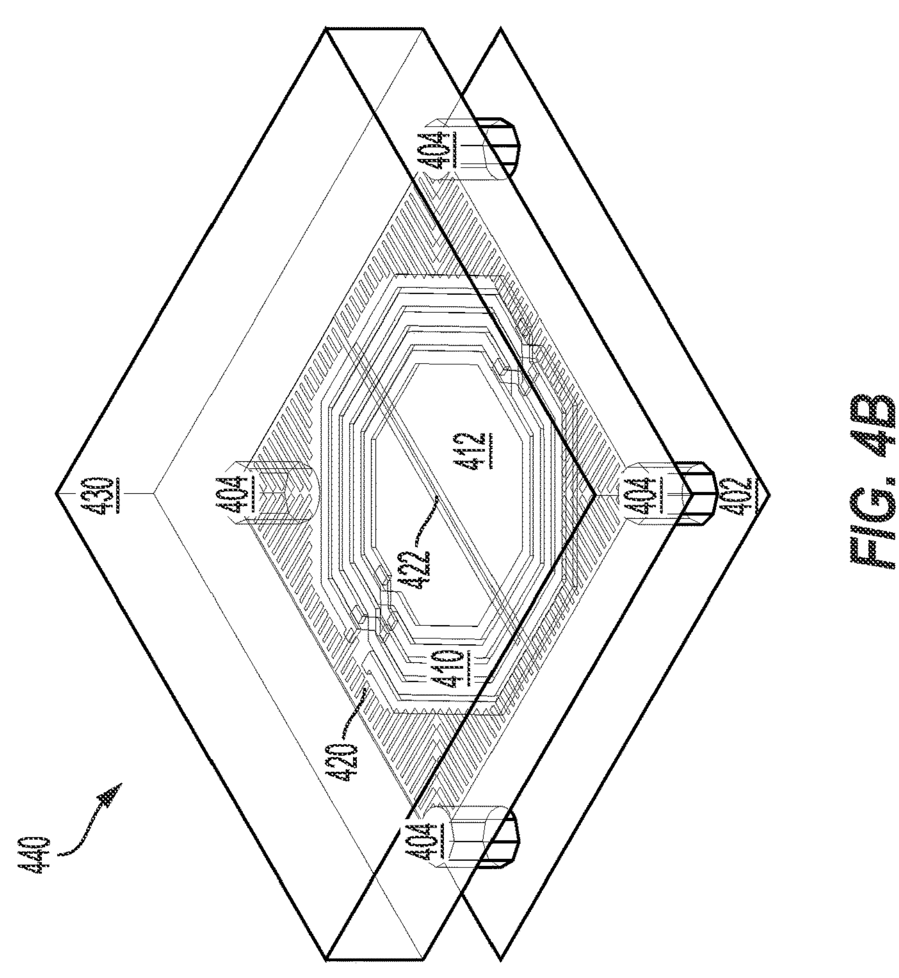
FIGS. 4A-4C are schematic diagrams illustrating a radio frequency integrated circuit (RFIC) including a patterned ground shield on a periphery of an inductor, according to various aspects of the present disclosure.
Figure 4A:
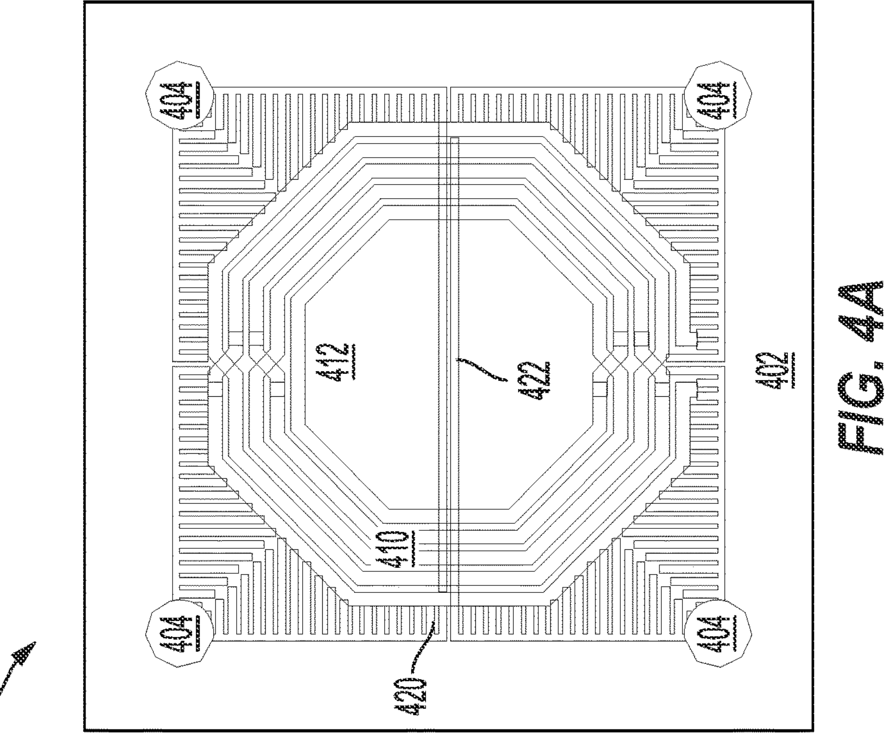
Figure 4C:
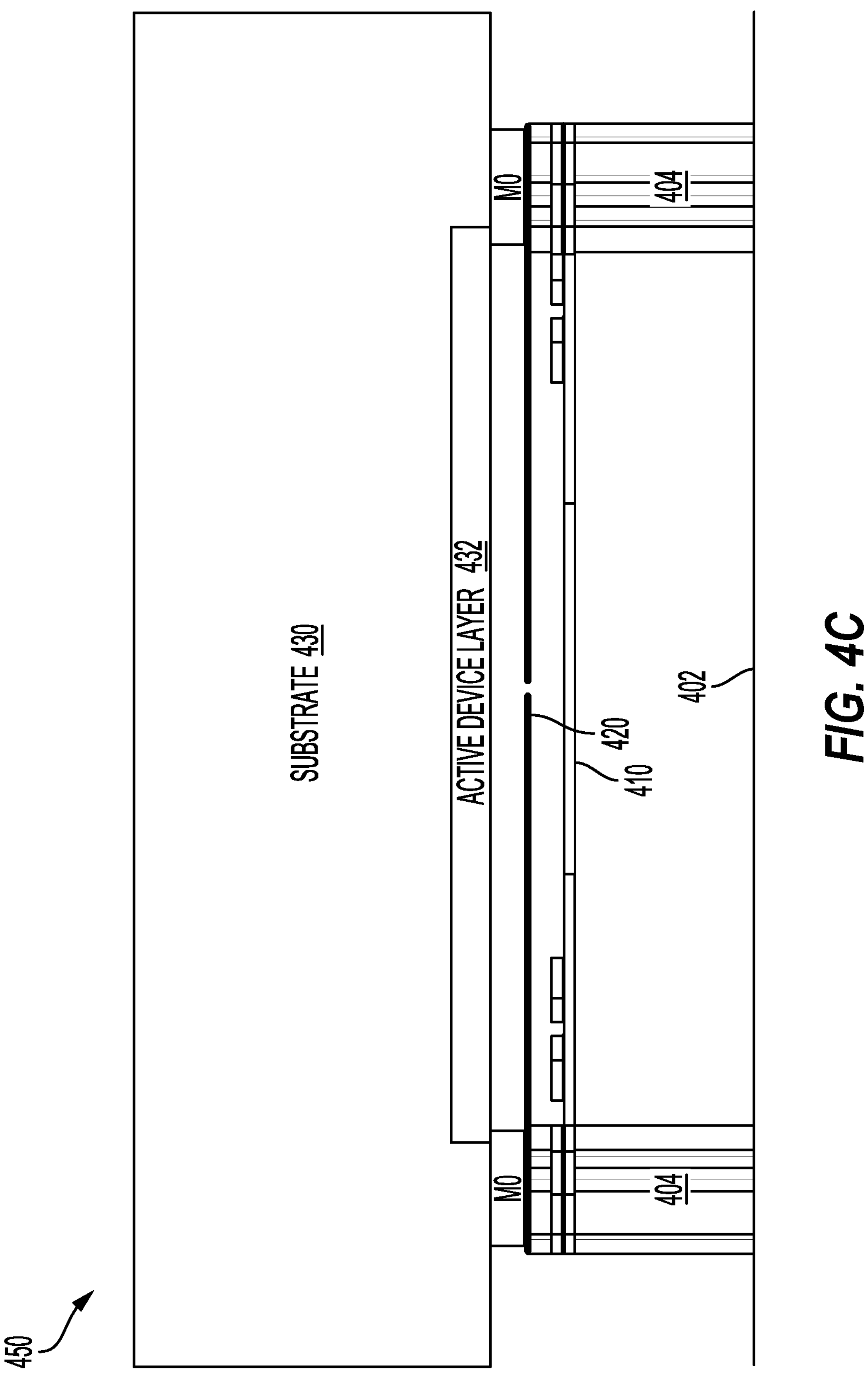

FIGS. 4A-4C are schematic diagrams illustrating a radio frequency integrated circuit (RFIC) including a patterned ground shield on a periphery of an inductor, according to various aspects of the present disclosure. FIG. 4A shows a top view of an RFIC 400, including a substrate 402 (e.g., a printed circuit board (PCB), package substrate) coupled to bumps 404 (e.g., ground bumps). In various aspects of the present disclosure, a multiturn inductor 410 includes a patterned ground shield 420 in a periphery of the multiturn inductor 410. In various aspects of the present disclosure, the patterned ground shield 420 includes ground lines 422 coupled to the multiturn inductor 410. In this example, the ground lines 422 of the patterned ground shield 420 extend across a circuitry under inductor (CUL) region 412 of the multiturn inductor 410.

FIG. 4B is a schematic diagram 440, further illustrating the RFIC 400, according to various aspects of the present disclosure. As shown in FIG. 4B, an active substrate 430 is coupled to the bumps 404. In various aspects of the present disclosure, the active substrate 430 may include an active device layer corresponding to the CUL region 412 of the multiturn inductor 410, for example, as shown in FIG. 4C.

FIG. 4C is a cross-sectional diagram 450, further illustrating the RFIC 400 of FIG. 4A, according to various aspects of the present disclosure. As shown in FIG. 4C, the active substrate 430 includes an active device layer 432. In various aspects of the present disclosure, the active device layer 432 of the active substrate 430 is coupled to the bumps 404 through BEOL layers, as further shown in FIG. 6A-6D. In various aspects of the present disclosure, the active devices in the active device layer 432 are positioned to align with the CUL region 412 of the multiturn inductor 410, for example, as shown in FIGS. 4A and 4B.

Figure 5A:
FIGS. 5A and 5B are schematic diagrams further illustrating the patterned ground shield and the RFIC of FIGS. 4A-4C, according to various aspects of the present disclosure.
Figure 5A:
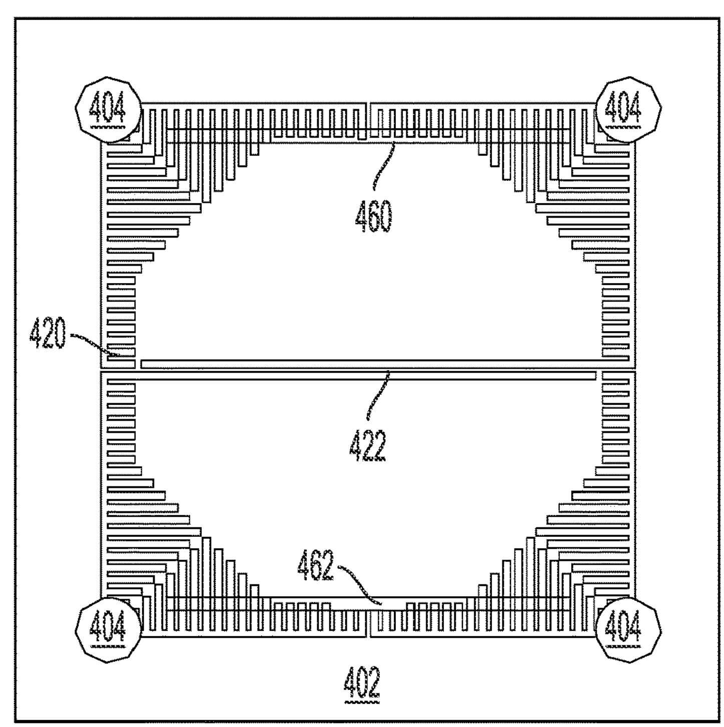
Figure 5B:
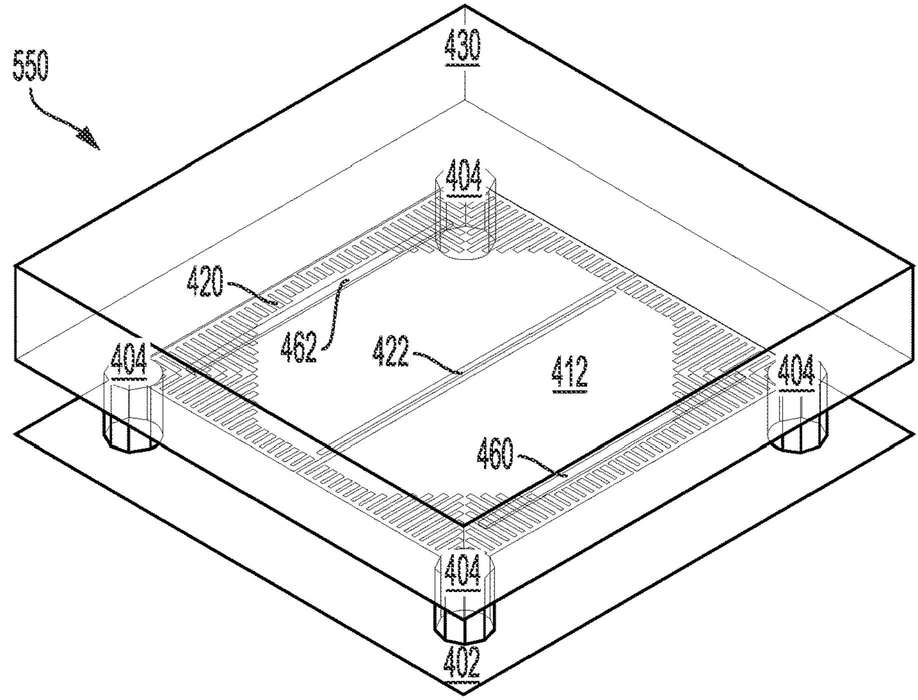

FIGS. 5A and 5B are schematic diagrams further illustrating the patterned ground shield 420 and the RFIC 400 of FIGS. 4A and 4B, according to various aspects of the present disclosure. FIG. 5A is a top-down view 500, illustrating formation of the patterned ground shield 420, according to various aspects of the present disclosure. In this example, the patterned ground shield 420 is formed between a first metal layer 460 (e.g., an M1 metal layer) and a second metal layer 462 (e.g., an M9 metal layer). The M1 metal layer (e.g., 460) is coupled to a first surface of the patterned ground shield 420, and a M9 metal layer (e.g., 462) is coupled to a second surface opposite the first surface of the patterned ground shield 420.

FIG. 5B is a schematic diagram further illustrating a perspective view 550 of the RFIC 400 of FIGS. 4A and 4B, according to various aspects of the present disclosure. As shown in FIG. 5B, the patterned ground shield 420 is coupled to the active substrate 430 through the first metal layer 460. In some aspects of the present disclosure, the first metal layer 460 is coupled to the active substrate 430 through the M0 metal layer.

FIGS. 6A-6D are schematic diagrams further illustrating the patterned ground shield and the RFIC of FIGS. 4A and 4B, according to various aspects of the present disclosure.

Figures 6A, 6B:
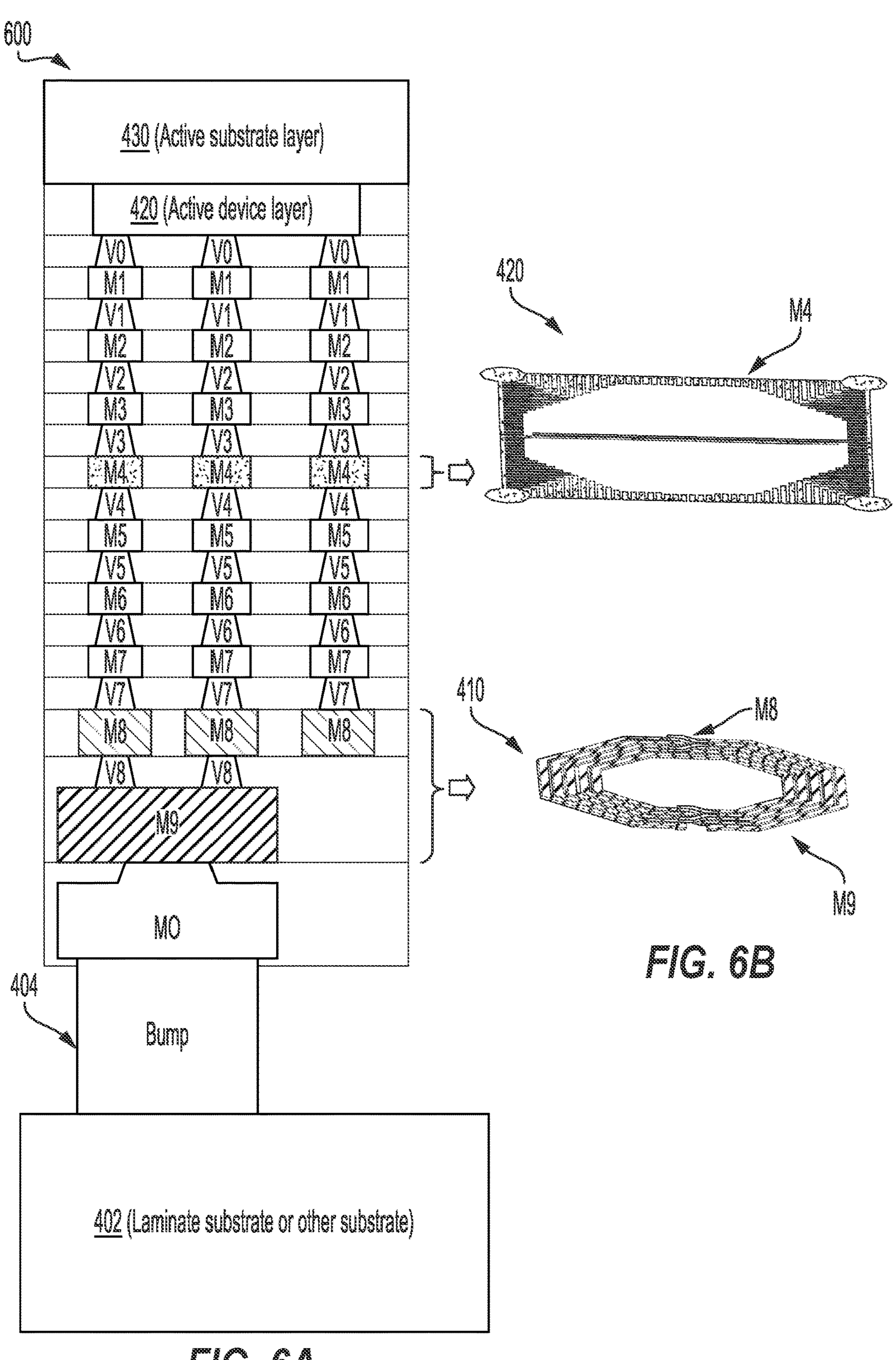
FIGS. 6A-6D are schematic diagrams further illustrating the patterned ground shield and the RFIC of FIGS. 4A and 4B, according to various aspects of the present disclosure.

FIG. 6A is a cross-sectional diagram 600, further illustrating the RFIC 400 of FIG. 4C, according to various aspects of the present disclosure. As shown in FIG. 6A, the active substrate 430 includes the active device layer 432. In various aspects of the present disclosure, the active device layer 432 of the active substrate 430 is coupled to the patterned ground shield 420 through BEOL layers V0, M1, V1, M2, V2, M3 and V3 (e.g., first BEOL layers). In this example, the patterned ground shield 420 is formed from the M4 metal layer (e.g., copper (Cu)), as shown in FIG. 6B, and coupled to the multiturn inductor 410 through BEOL layers V4, M5, V5, M6, V6, M7, and V7 (e.g., second BEOL layers). Additionally, the multiturn inductor 410 is formed from the M8 metal layer, the V8 via layer, and the M9 metal layer, as shown in FIG. 6B.

Figure 6C:
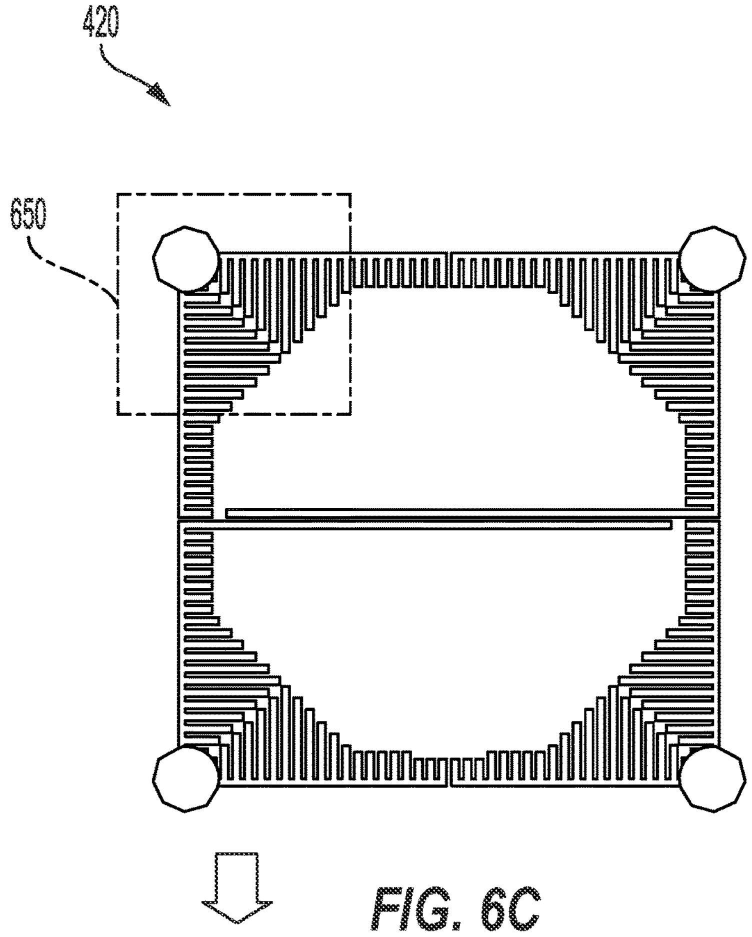
Figure 6D:
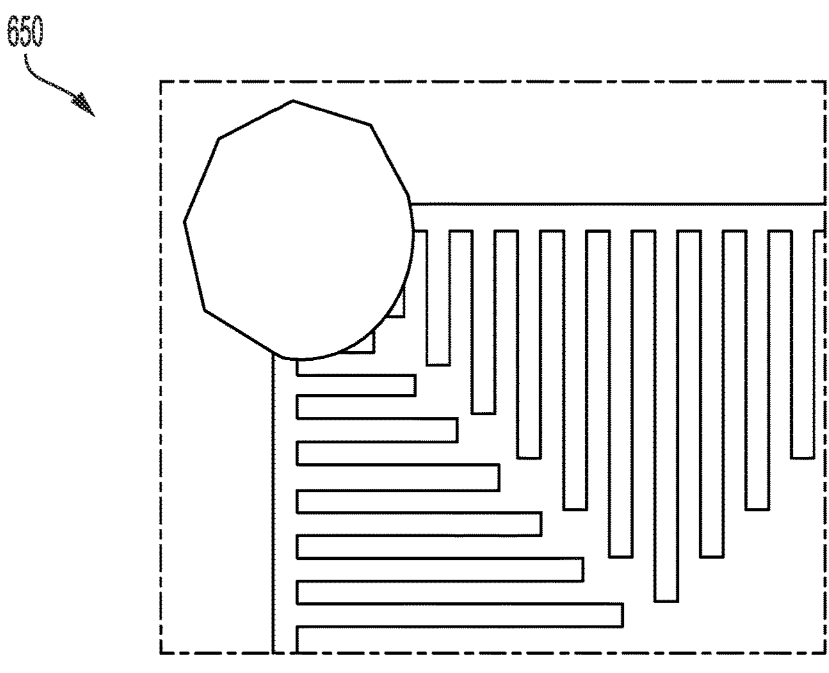

FIGS. 6C and 6D are schematic diagrams further illustrating the multiturn inductor 410, according to various aspects of the present disclosure. As shown in FIG. 6C, the patterned ground shield 420 is shown with a highlighted portion 650, which is shown in an exploded view in FIG. 6D. As shown in FIG. 6D, the patterned ground shield 420 is designed from the M4 metal layer, between a top metal layer (e.g., M9) and a bottom metal layer (e.g., M1). In various aspects of the present disclosure, the M4 metal is composed of copper (Cu), among complementary metal oxide semiconductor (CMOS) BEOL layers. In this example, the dimensions of the patterned ground shield 420 are shown as a five (5) microns for the M4 metal layer pattern width and a five (5) micron space between the M4 metal layer patterns.

As further illustrated in FIG. 6A, the multiturn inductor 410 is designed from the M9 metal layer, the V8 via layer, and M8 metal layer (e.g., the main inductor patterns using M9 metal layer, the cross-connection layers using the M8 metal layer, and an interconnect via between the M9 metal layer and the M8 metal layer using the V8 via layer). In this example, the multiturn inductor is connected with one of the bumps 404 through an M0 metal layer.

In various aspects of the present disclosure, the patterned ground shield 420 simultaneously improves key performance indicators (KPIs) of the multiturn inductor 410 (e.g., an inductance value, a self-resonance frequency (SRF), a quality (Q)-factor) as well as device isolation. Additionally, placement of the patterned ground shield 420 outside the periphery of the multiturn inductor 410 improves back-end-of-line (BEOL) routings under the patterned ground shield 420 through less parasitic components. In particular, this placement of the patterned ground shield 420 supports the CUL region 412 with the patterned ground shield 420 placement technique without degrading the inductor KPIs. Support for the CUL region 412 beneficially saves the active device layer 432 (e.g., a complementary metal oxide semiconductor (CMOS) active area) under the multiturn inductor 410, which achieves a wafer cost saving of over ten percent (10%).

Figure 7:
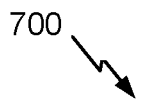
FIG. 7 is a process flow diagram illustrating a method for fabricating a patterned ground shield on a periphery of an inductor, according to various aspects of the present disclosure.
Figure 7:
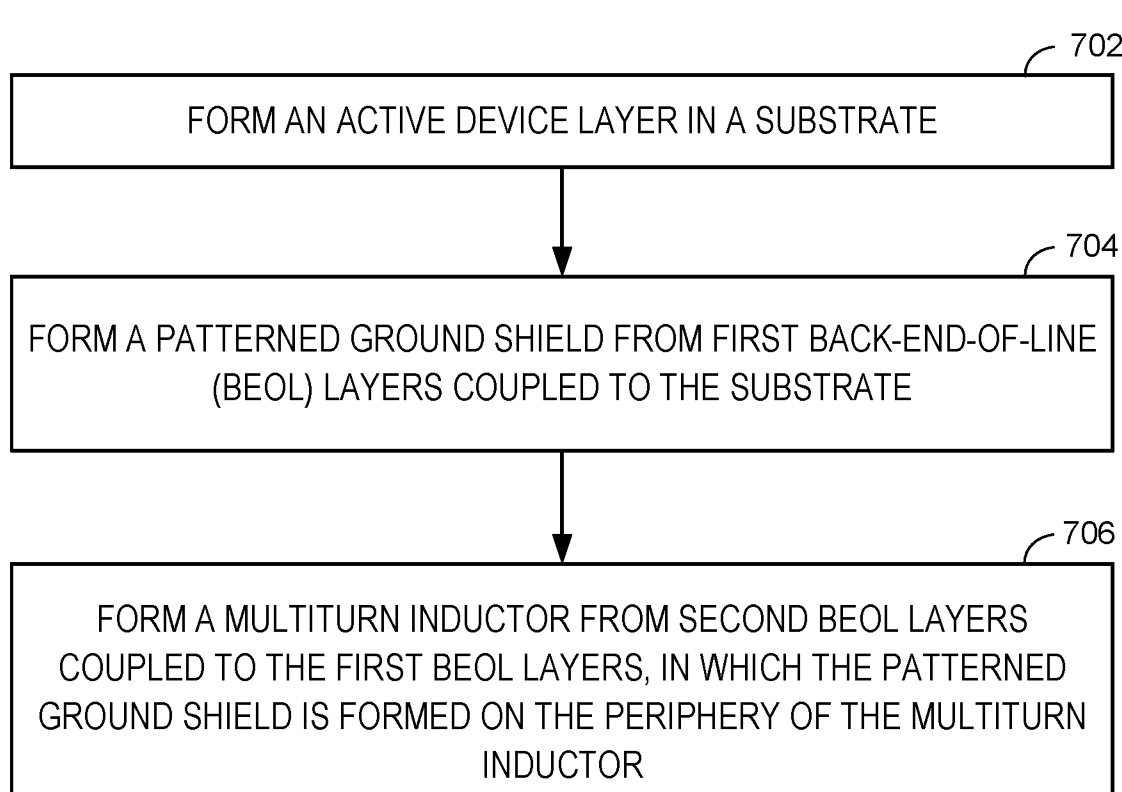

FIG. 7 is a process flow diagram illustrating a method for fabricating a patterned ground shield on a periphery of a multiturn inductor, according to various aspects of the present disclosure. A method 700 begins at block 702, in which an active device layer is form in a substrate. For example, the active substrate 430 may include an active device layer corresponding to the CUL region 412 of the multiturn inductor 410, for example, as shown in FIG. 4C.

At block 704, a patterned ground shield is formed from first back-end-of-line (BEOL) layers coupled to the substrate. For example, as shown in FIG. 6D, the patterned ground shield 420 is designed from the M4 metal layer, between a top metal layer (e.g., M9) and a bottom metal layer (e.g., M1). In various aspects of the present disclosure, the M4 metal is composed of copper (Cu), among complementary metal oxide semiconductor (CMOS) BEOL layers. In this example, the dimensions of the patterned ground shield 420 are shown as a five (5) microns for the M4 metal layer pattern width and a five (5) micron space between the M4 metal layer patterns.

At block 706, a multiturn inductor is formed from second BEOL layers coupled to the first BEOL layers, in which the patterned ground shield is formed on the periphery of the multiturn inductor. For example, as shown in FIG. 6A, the multiturn inductor 410 is designed from the M9 metal layer, the V8 via layer, and M8 metal layer (e.g., the main inductor patterns using M9 metal layer, the cross-connection layers using the M8 metal layer, and an interconnect via between the M9 metal layer and the M8 metal layer using the V8 via layer). In this example, the multiturn inductor is connected with one of the bumps 404 through an M0 metal layer.

As shown in FIG. 6B, the method 700 may further including forming cross connection layers of the multiturn inductor 410 using a first metal layer (M8) of the second BEOL layers. Additionally, the method 700 includes forming first vias (V8) of the second BEOL layers coupled to the cross-connection layers of the multiturn inductor 410. The method 700 also includes forming a pattern of the multiturn inductor 410 using a second metal layer (M9) of the second BEOL layers coupled to cross connection layers of the multiturn inductor 410 through the first vias (V8) of the second BEOL layers.

Figure 8:
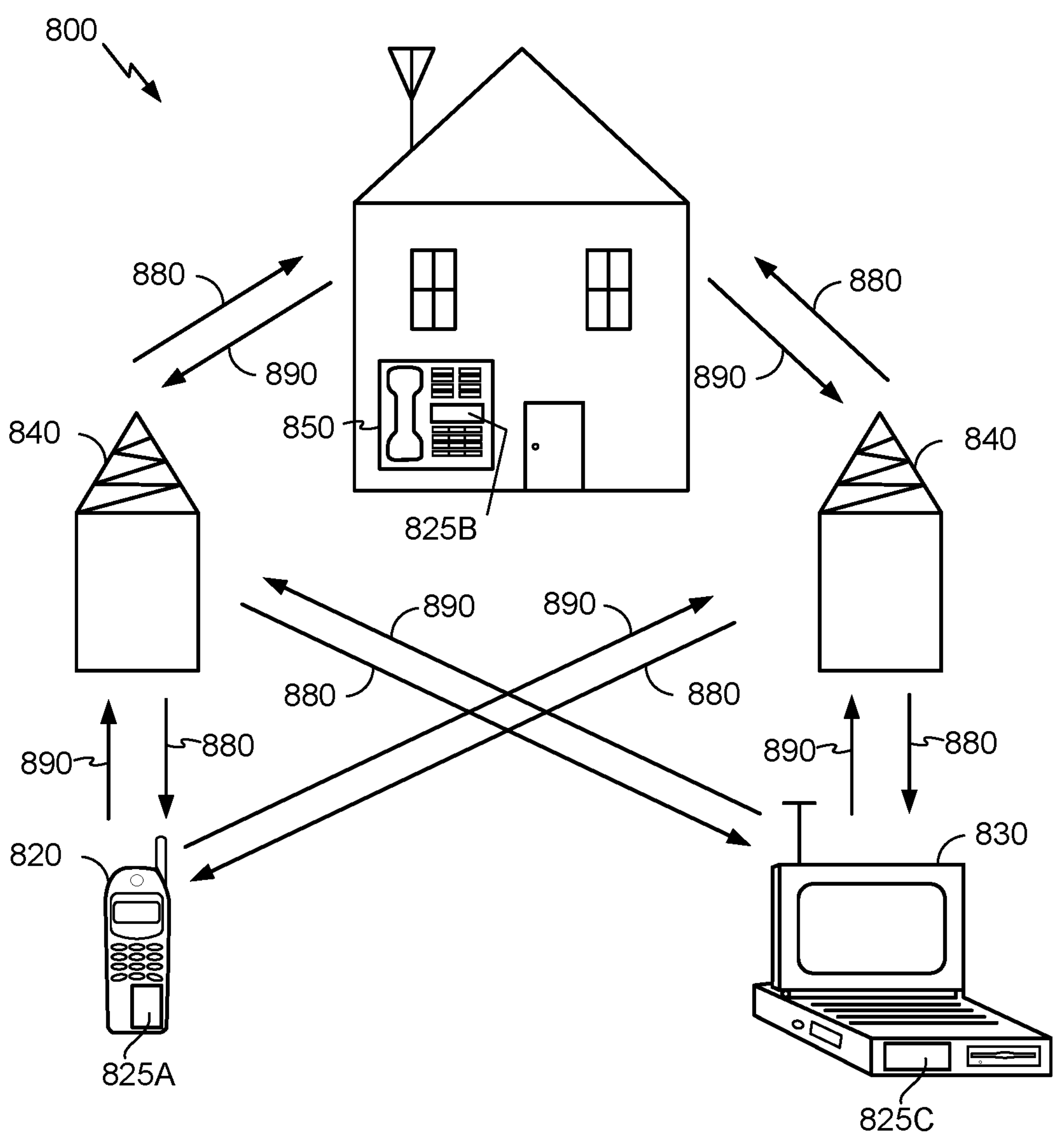
FIG. 8 is a block diagram showing an exemplary wireless communications system in which an aspect of the present disclosure may be advantageously employed.

FIG. 8 is a block diagram showing an exemplary wireless communications system 800 in which an aspect of the present disclosure may be advantageously employed. For purposes of illustration, FIG. 8 shows three remote units 820, 830, and 850 and two base stations 840. It will be recognized that wireless communications systems may have many more remote units and base stations. Remote units 820, 830, and 850 include integrated circuit (IC) devices 825A, 825C, and 825B that include the disclosed inductive device structure and patterned ground shield. It will be recognized that other devices may also include the disclosed inductive device structure, such as the base stations 840, switching devices, and network equipment. FIG. 8 shows forward link signals 880 from the base stations 840 to the remote units 820, 830, and 850, and reverse link signals 890 from the remote units 820, 830, and 850 to the base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a communications device, personal digital assistant (PDA), a fixed location data unit, such as meter reading equipment, or other device that stores or retrieves data or computer instructions, or combinations thereof. Although FIG. 8 illustrates remote units according to the aspects of the present disclosure, the present disclosure is not limited to these exemplary illustrated units. Aspects of the present disclosure may be suitably employed in many devices, which include the disclosed inductive device structure and patterned ground shield.

Figure 9:
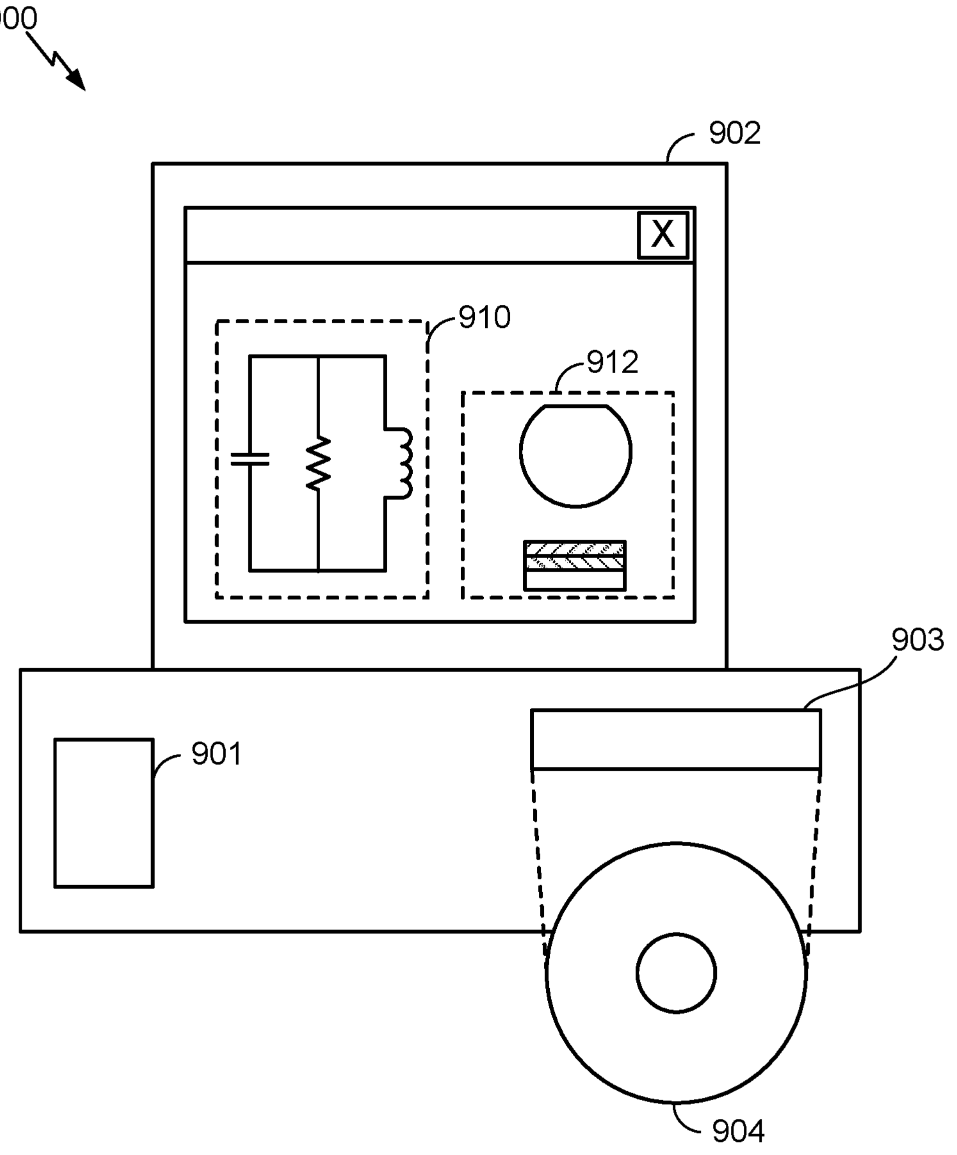
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the inductive device structure disclosed above. A design workstation 900 includes a hard disk 901 containing operating system software, support files, and design software such as Cadence or OrCAD. The design workstation 900 also includes a display 902 to facilitate design of a circuit 910 or a radio frequency (RF) component 912 such as an inductor having a patterned ground shield at a periphery. A storage medium 904 is provided for tangibly storing the design of the circuit 910 or the RF component 912 (e.g., the inductive device structure). The design of the circuit 910 or the RF component 912 may be stored on the storage medium 904 in a file format such as GDSII or GERBER. The storage medium 904 may be a compact disc read-only memory (CD-ROM), digital versatile disc (DVD), hard disk, flash memory, or another appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the RF component 912 by decreasing the number of processes for designing semiconductor wafers.

Implementation examples are described in the following numbered clauses:

1. A device, comprising:

a substrate;

a multiturn inductor coupled to the substrate; and a patterned ground shield on a periphery of the multiturn inductor and coupled to the substrate.

2. The device of clause 1, further comprising:

a first metal layer coupled between the substrate and on a first surface of the patterned ground shield; and a second metal layer coupled to a second surface opposite the first surface of the patterned ground shield.

3. The device of any of clauses 1 or 2, in which the substrate comprises an active device layer, below the multiturn inductor.

4. The device of any of clauses 1-3, in which the multiturn inductor is coupled to the substrate through the pattern ground shield.

5. The device of any of clauses 1-4, further comprising a package substrate coupled to the multiturn inductor through ground bumps.

6. The device of any of clauses 1-5, in which the multiturn inductor surrounds a circuitry under inductor (CUL) region.

7. The device of clause 6, in which the patterned ground shield comprises ground lines coupled to the multiturn inductor.

8. The device of clause 7, in which the ground lines of the patterned ground shield extend across the CUL region of the multiturn inductor.

9. The device of any of clauses 1-8, in which the device is integrated in a radio frequency integrated circuit (RFIC).

10. The device of clause 9, in which the RFIC is incorporated in at least one of a music player, a video player, an entertainment unit, a navigation device, a communications device, a personal digital assistant (PDA), a fixed location data unit, a mobile phone, and a portable computer.

11. A method for fabricating a device having a patterned ground shield on a periphery of a multiturn inductor, comprising:

forming an active device layer in a substrate;

forming the patterned ground shield from first back-end-of-line (BEOL) layers coupled to the substrate; and forming the multiturn inductor from second BEOL layers coupled to the first BEOL layers, in which the patterned ground shield is formed on the periphery of the multiturn inductor.

12. The method of clause 11, further comprising:

a first BEOL via coupled between the substrate and on a first surface of the patterned ground shield; and a second BEOL via coupled to a second surface opposite the first surface of the patterned ground shield.

13. The method of any of clauses 11 or 12, in which forming the multiturn inductor comprises:

forming cross connection layers of the multiturn inductor using a first metal layer of the second BEOL layers;

forming first vias of the second BEOL layers coupled to the cross-connection layers of the multiturn inductor; and forming a pattern of the multiturn inductor using a second metal layer of the second BEOL layers coupled to cross connection layers of the multiturn inductor through the first vias of the second BEOL layers.

14. The method of any of clauses 11-13, in which the multiturn inductor is coupled to the substrate through the pattern ground shield.

15. The method of any of clauses 11-14, further comprising coupling a package substrate to the multiturn inductor through ground bumps.

16. The method of any of clauses 11-15, in which the multiturn inductor surrounds a circuitry under inductor (CUL) region.

17. The method of clause 16, in which the patterned ground shield comprises ground lines coupled to the multi-turn inductor.

18. The method of clause 17, in which the ground lines of the patterned ground shield extend across the CUL region of the multiturn inductor.

19. The method of any of clauses 11-18, further comprising integrating the device in a radio frequency integrated circuit (RFIC).

20. The method of clause 19, further comprising incorporating the RFIC in at least one of a music player, a video player, an entertainment unit, a navigation device, a communications device, a personal digital assistant (PDA), a fixed location data unit, a mobile phone, and a portable computer.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. A device, comprising:
- a substrate having an active device layer;
- a multiturn inductor comprised of first back-end-of-line (BEOL) metal layers above the active device layer of the substrate; and
- a patterned ground shield on a periphery of the multiturn inductor and comprised of second BEOL metal layers coupled to the first BEOL metal layers and the active device layer of the substrate.

2. The device of claim 1, further comprising:
- a first BEOL metal layer coupled between the active device layer of the substrate and on a first surface of the patterned ground shield; and
- a second BEOL metal layer coupled to a second surface opposite the first surface of the patterned ground shield.

3. The device of claim 1, in which the multiturn inductor is coupled to the active device layer of the substrate through the patterned ground shield.

4. The device of claim 1, further comprising a package substrate coupled to the multiturn inductor through ground bumps.

5. The device of claim 1, in which the multiturn inductor surrounds a circuitry under inductor (CUL) region.

6. The device of claim 5, in which the patterned ground shield comprises ground lines coupled to the multiturn inductor.

7. The device of claim 6, in which the ground lines of the patterned ground shield extend across the CUL region of the multiturn inductor.

8. The device of claim 1, in which the device is integrated in a radio frequency integrated circuit (RFIC).

9. The device of claim 8, in which the RFIC is incorporated in at least one of a music player, a video player, an entertainment unit, a navigation device, a communications device, a personal digital assistant (PDA), a fixed location data unit, a mobile phone, and a portable computer.

10. A method for fabricating a device having a patterned ground shield on a periphery of a multiturn inductor, comprising:
- forming an active device layer in a substrate;
- forming the patterned ground shield from first back-end-of-line (BEOL) layers coupled to the active layer of the substrate; and
- forming the multiturn inductor from second BEOL layers coupled to the first BEOL layers, in which the patterned ground shield is formed on the periphery of the multiturn inductor.

11. The method of claim 10, further comprising:
- a first BEOL via coupled between the substrate and on a first surface of the patterned ground shield; and
- a second BEOL via coupled to a second surface opposite the first surface of the patterned ground shield.

12. The method of claim 10, in which forming the multiturn inductor comprises:
- forming cross connection layers of the multiturn inductor using a first metal layer of the second BEOL layers;
- forming first vias of the second BEOL layers coupled to the cross-connection layers of the multiturn inductor; and
- forming a pattern of the multiturn inductor using a second metal layer of the second BEOL layers coupled to cross connection layers of the multiturn inductor through the first vias of the second BEOL layers.

13. The method of claim 10, in which the multiturn inductor is coupled to the active layer of the substrate through the patterned ground shield.

14. The method of claim 10, further comprising coupling a package substrate to the multiturn inductor through ground bumps.

15. The method of claim 10, in which the multiturn inductor surrounds a circuitry under inductor (CUL) region.

16. The method of claim 15, in which the patterned ground shield comprises ground lines coupled to the multiturn inductor.

17. The method of claim 16, in which the ground lines of the patterned ground shield extend across the CUL region of the multiturn inductor.

18. The method of claim 10, further comprising integrating the device in a radio frequency integrated circuit (RFIC).

19. The method of claim 18, further comprising incorporating the RFIC in at least one of a music player, a video player, an entertainment unit, a navigation device, a communications device, a personal digital assistant (PDA), a fixed location data unit, a mobile phone, and a portable computer.

* * * * *